United States Patent [19]
Yamazaki

[11] Patent Number: 4,599,482
[45] Date of Patent: Jul. 8, 1986

[54] SEMICONDUCTOR PHOTOELECTRIC CONVERSION DEVICE AND METHOD OF MAKING THE SAME

[75] Inventor: Shunpei Yamazaki, Tokyo, Japan

[73] Assignee: Semiconductor Energy Lab. Co., Ltd., Tokyo, Japan

[21] Appl. No.: 586,699

[22] Filed: Mar. 6, 1984

[30] Foreign Application Priority Data

Mar. 7, 1983 [JP] Japan ............................ 58-36850
Oct. 18, 1983 [JP] Japan ........................... 58-194878

[51] Int. Cl.$^4$ ............................................. H01L 31/18
[52] U.S. Cl. ..................................... 136/259; 136/256; 136/258; 357/30; 357/55; 427/74; 29/572
[58] Field of Search ............. 136/256, 258 AM, 259; 357/2, 30, 55; 427/39, 74, 86; 29/572

[56] References Cited

U.S. PATENT DOCUMENTS 4,385,199 5/1983 Hamakawa et al. ........ 136/258 AM
4,450,316 5/1984 Hamakawa et al. .............. 136/256
4,500,743 2/1985 Hayashi et al. ............. 136/258 AM

FOREIGN PATENT DOCUMENTS

55-108780 8/1980 Japan ................................. 136/259
57-49278 3/1982 Japan ................................. 136/259

Primary Examiner—Aaron Weisstuch
Attorney, Agent, or Firm—Gerald J. Ferguson; James E. Bryan; Michael P. Hoffman

[57] ABSTRACT

In a semiconductor photoelectric conversion device in which a first light-transparent conductive layer serving as an electrode is formed on a light transparent substrate, a non-single-crystal semiconductor laminate member having formed therein at least one PIN junction is formed on the first conductive layer and a second conductive layer serving as another electrode is formed on the semiconductor laminate member, the non-single-crystal semiconductor layer on the side of the first conductive layer is made of $Si_xC_{1-x}$ ($0<x<1$), and the boundary between the first conductive layer and semiconductor laminate member is formed by a first uneven surface including a number of convexities. Further, the second conductive layer is reflective, and the boundary between the semiconductor laminate member and the second conductive layer is formed by a second uneven surface.

16 Claims, 12 Drawing Figures

SEMICONDUCTOR PHOTOELECTRIC CONVERSION DEVICE AND METHOD OF MAKING THE SAME

BACKGROUND OF THE INVENTION

1. Field of the Invention

The present invention relates to improvement in or relating to a semiconductor photoelectric conversion device which has a light-transparent substrate, a light-transparent conductive layer formed on the substrate serving as a first electrode, a non-single-crystal semiconductor laminate member comprised of a P- or N-type first non-single-crystal semiconductor layer formed on the first electrode, an I-type second non-single-crystal semiconductor layer formed on the first non-single-crystal semiconductor layer and a third non-single-crystal semiconductor layer formed on the second non-single-crystal semiconductor layer and opposite in conductivity from the first non-single-crystal semiconductor layer, and another conductive layer formed on the non-single-crystal semiconductor laminate member serving as a second electrode.

Also, the invention pertains to a method for the manufacture of such a semiconductor photoelectric conversion device.

2. Description of the Prior Art

In conventional semiconductor photoelectric conversion devices of the abovesaid type, the conductive layer serving as a first electrode and the non-single-crystal semiconductor laminate member usually form therebetween a flat and smooth boundary.

In such a case, since the area of contact between the conductive layer serving as a first electrode and the non-single-crystal semiconductor laminate member is not greater than the area in which they are opposed, there is a limit to the reduction of the contact resistance between the conductive layer serving as a first electrode and the non-single-crystal semiconductor laminate member, imposing certain limitations on enhancement of the photoelectric conversion efficiency.

Furthermore, the non-single-crystal semiconductor laminate member and the conductive layer serving as a second electrode also form a flat and smooth boundary therebetween.

With the conventional semiconductor photoelectric conversion device of such a structure, light which is incident on the light-transparent substrate on the side opposite the conductive layer serving as a first electrode and passes thereinto via the substrate, mostly enters into the non-single-crystal semiconductor laminate member, but a portion of the light is reflected at the boundary between the conductive layer serving as a first electrode and the non-signle-crystal semiconductor laminate member and back to the outside through the conductive layer and the light-transparent substrate.

The light having entered into the non-single-crystal semiconductor laminate member travels therein in its thickwise direction, creating electron-hole pairs. When the light propagates in the non-single-crystal semiconductor laminate member from the boundary between it and the light-transparent conductive layer serving as a first electrode to the boundary between it and the conductive layer serving as a second electrode, the light travels only a distance equal to the thickness of the non-single-crystal semiconductor laminate member.

Holes (or electrons) of the electron-hole pairs generated in the non-signle-crystal semiconductor laminate member flow across thereto to reach the light-transparent conductive layer serving as a first electrode, and the electrons (or holes) flow across the non-single-crystal semiconductor laminate member to reach the conductive layer serving as a second electrode, developing electromotive force across both conductive layers.

In this case, the maximum value of the difference between the thickness of the non-single-crystal semiconductor laminate member and the thickness of its first non-single-crystal semiconductor layer formed in contact with the conductive layer serving as a first, electrode cannot be selected greater than the maximum diffusion length over which the electrons (or holes) of the electron-hole pairs, created at and in the vicinity of the boundary between the first non-single-crystal semiconductor layer of the non-single-crystal semiconductor laminate member formed in contact with the conductive layer serving as a first electrode and the second non-single-crystal semiconductor layer formed thereon, can flow to reach the conductive layer serving as a second electrode.

Therefore, when light travels in the non-single-crystal semiconductor laminate member from the boundary between it and the conductive layer serving as a first electrode to the boundary between it and the conductive layer serving as a second electrode, the light does not travel in excess of the abovesaid maximum diffusion length in the region from the boundary between the first non-signle-crystal semiconductor layer of the non-signle-crystal semiconductor laminate member formed in contact with the conductive layer serving as a first electrode and the second non-single-crystal semiconductor layer formed thereon to the boundary between the non-single-crystal semiconductor laminate member and the conductive layer serving as a second electrode.

For the reason given above, the prior art semiconductor photoelectric conversion devices are extremely poor in efficiency of utilization of incident light, and hence it has been very difficult to achieve a photoelectric conversion efficiency higher than 8%.

SUMMARY OF THE INVENTION

It is therefore an object of the present invention to provide a novel semiconductor photoelectric conversion device which achieves an extremely high photoelectric conversion efficiency as compared with the conventional semiconductor photoelectric conversion devices.

Another object of the present invention is to provide a novel method which permits easy manufacture of the semiconductor photoelectric conversion device of the present invention.

The semiconductor photoelectric conversion device of the present invention comprises a light-transparent substrate, a light-transparent conductive layer formed on the substrate and serving as a first electrode, a non-single-crystal semiconductor laminate member comprised of a P- or N-type first non-single-crystal semiconductor layer formed on the conductive layer serving as a first electrode, an I-type second non-single-crystal semiconductor layer formed on the first non-single-crystal semiconductor layer, and a third non-single-crystal semiconductor layer formed on the second non-single-crystal semiconductor layer and opposite in conductivity from the first non-single-crystal semiconductor layer, and a conductive layer formed on the non-single-crystal semiconductor laminate member and serving as a second electrode, as is the case with the conventional semiconductor photoelectric conversion device described previously.

According to the semiconductor photoelectric conversion device of the present invention, however, the first non-single-crystal semiconductor layer of the non-single-crystal semiconductor laminate member is formed of $Si_xC_{1-x}$ (where $0<x<1$), or a material consisting principally thereof, and the conductive layer serving as a first electrode and the first non-single-crystal semiconductor layer of the non-single-crystal semiconductor laminate member are laminated to form therebetween a first uneven boundary.

With such an arrangement, since the first non-single-crystal semiconductor layer of the non-single-crystal semiconductor laminate member has a large energy gap, high-energy light can be entered into the non-single-crystal semiconductor laminate member. Further, since the contact area between the conductive layer serving as a first electrode and the non-single-crystal semiconductor laminate member is greater than the area in which they are opposed, the contact resistance between them is far lower than in the case where they are laminated with a flat and smooth boundary formed therebetween in the prior art devices.

Accordingly, by forming the first non-single-crystal semiconductor layer of the non-single-crystal semiconductor laminate member of $Si_xC_{1-x}$, or a material consisting principally thereof, it is possible to obtain a photoelectric conversion efficiency far higher than that obtainable with the conventional devices although the resistivity of the abovesaid first non-single-crystal semiconductor layer is high.

Moreover, in the case of the semiconductor photoelectric conversion device of the present invention, an appreciable portion of the light which is incident on the substrate from the outside thereof on the side opposite from the conductive layer serving as a first electrode and passes thereinto enters into the non-single-crystal semiconductor laminate member, and a portion of the light is reflected at the boundary between the conductive layer serving as a first electrode and the non-single-crystal semiconductor laminate member. The reflected light travels in the conductive layer serving as a first electrode towards the substrate and is reflected at the boundary therebetween. A considerable portion of the reflected light enters into the non-signle-crystal semiconductor laminate member.

Therefore, the semiconductor photoelectric conversion device of the present invention utilizes incident light with far higher efficiency than that obtainable with the conventional semiconductor photoelectric conversion device, and hence achieves far higher photoelectric conversion efficiency than does the conventional semiconductor photoelectric conversion device.

Besides, in the semiconductor photoelectric conversion device of the present invention, the boundary between the conductive layer serving as a first electrode and the non-single-crystal semiconductor laminate member is formed by the first uneven surface, and the conductive layer serving as a second electrode is reflective and, further, the boundary between the non-single-crystal semiconductor laminate member and the conductive layer serving as a second electrode is formed by a second uneven surface.

With such an arrangement, a considerable portion of the light which passes into the conductive layer serving as a first electrode through the substrate from the outside thereof enters into the non-single-crystal semiconductor laminate member. An appreciable portion of the light having entered into the non-single-crystal semiconductor laminate member travels therein in a direction oblique to its thickwise direction, creating electron-hole pairs in the non-single-crystal semiconductor laminate member. In this case, the distance over which the light travels in the non- single-crystal semiconductor laminate member obliquely to its thickwise direction from the boundary between it and the conductive layer serving as a first electrode to the boundary between it and the conductive layer serving as a second electrode is greater than the thickness of the non-single-crsytal semiconductor laminate member.

Further, holes (or electrons) of the electron-hole pairs created in the non-signle-crystal semiconductor laminate member flow across it to reach the conductive layer serving as a first electrode and the electrons (or holes) flow across the semiconductor laminate member to reach the conductive layer serving as a second electrode, thereby developing electromotive force across both conductive layers. In this case, the a minimum value of the distance between the inner sides of the both conductive layers is smaller than the thickness of the non-single-crystal semiconductor laminate member. The maximum value of the difference between the thickness of the non-single-crystal semiconductor laminate member and the thickness of the first non-single-crystal semiconductor layer of the non-single-crystal semiconductor laminate member formed in contact with the conductive layer serving as a first electrode on the line of the minimum distance between the inner sides of the both conductive layers cannot be selected greater than a maximum distance of travel over which the electrons (or holes) of the electron-hole pairs created at and in the vicinity of the boundary between the first non-signle-crystal semiconductor layer of the non-single-crystal semiconductor laminate member formed in contact with the conductive layer serving as a first electrode and the second non-single-crystal semiconductor layer formed thereon can reach the conductive layer serving as a second electrode along the line of the minimum distance between the inner sides of both conductive layers. But the minimum value of the difference between the thickness of the non-single-crystal semiconductor laminate member and its first non-single-crystal semiconductor layer formed in contact with the conductive layer serving as a first electrode is greater than the aforementioned maximum distance of travel. Consequently, when the light travels in the non-single-crystal semiconductor laminate member from the boundary between it and the conductive layer serving as a first electrode to the boundary between it and the conductive layer serving as a second electrode, the distance of travel of the light in the region from the boundary between the first non-single-crystal semiconductor layer of the non-single-crystal semiconductor laminate member formed in contact with the conductive layer serving as a first electrode and the second non-single-crystal semiconductor layer formed thereon to the boundary between the non-single-crystal semiconductor laminate member and the conductive layer serving as a second electrode is greater than the aforesaid maximum distance of travel.

Of the light which has passed into the non-single-crystal semiconductor laminate member, all the light which reaches the conductive layer serving as a second electrode is reflected at the boundary between the nonsingle-crystal semiconductor laminate member and the conductive layer serving as a second electrode and back into the non-single-crystal semiconductor laminate member. Of the thus reflected light, light which reaches the conductive layer serving as a first electrode is reflected at the boundary between it and the non-single-crystal semiconductor laminate member and back into the latter.

The abovesaid arrangement ensures to markedly increase the efficiency of utilization of incident light as compared with that obtainable with the prior art device, providing for improved photoelectric conversion efficiency.

The semiconductor photoelectric conversion device manufacturing method of the present invention includes a step of forming, on a light-transparent substrate, a light-transparent conductive layer serving as a first electrode, the surface of which is formed by a first uneven surface, a step of forming, on the first uneven surface of the conductive layer serving as a first electrode, a non-single-crystal semiconductor laminate member, the surface of which is formed by a fourth uneven surface and which forms between it and the conductive layer serving as a first electrode a first uneven boundary corresponding to the first uneven surface, and a step of forming, on the fourth uneven surface of the non-single-crystal semiconductor laminate member, a reflective conductive layer serving as a second electrode which forms between it and the non-single-crystal semiconductor laminate member a second uneven boundary corresponding to the fourth uneven surface.

In the above manufacturing method, the step of forming the non-single-crystal semiconductor laminate member includes a sub-step of depositing, on the first uneven surface of the conductive layer serving as a first electrode, a first non-single-crystal semiconductor layer of P- or N-type $Si_xC_{1-x}$ (where $0<x<1$), or a material consisting thereof, by a vapor growth method using a methyl silane compound.

In this case, even if the conductive layer serving as a first electrode is made of a metallic oxide, the first non-single-crystal semiconductor layer can be easily formed which contains little or no oxygen supplied from the metallic oxide.

Such a manufacturing method as mentioned above permits easy fabracation of the semiconductor photoelectric conversion device of the present invention which possesses the aforementioned advantages.

Other objects, features and advantages of the present invention will become more fully apparent from the following detailed description taken in conjunction with the accompanying drawings.

DESCRIPTION OF THE PREFERRED EMBODIMENTS

Figure 1:
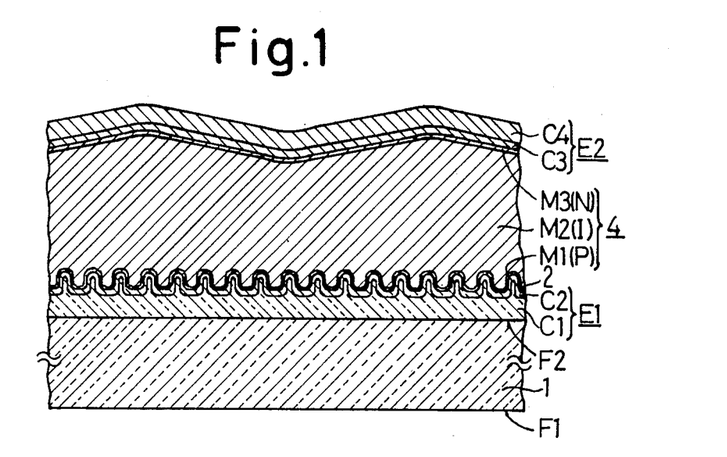
FIG. 1 is a cross-sectional view schematically showing the principal parts of an embodiment of the semiconductor photoelectric conversion device of the present invention.

FIG. 1 illustrates an embodiment of the semiconductor photoelectric conversion device of the present invention, which has such a construction as will be described hereinbelow.

The semiconductor photoelectric conversion device is provided with a light-transparent insulating substate 1 formed of glass, light-transparent organic synthetic resin or the like.

Figure 2:
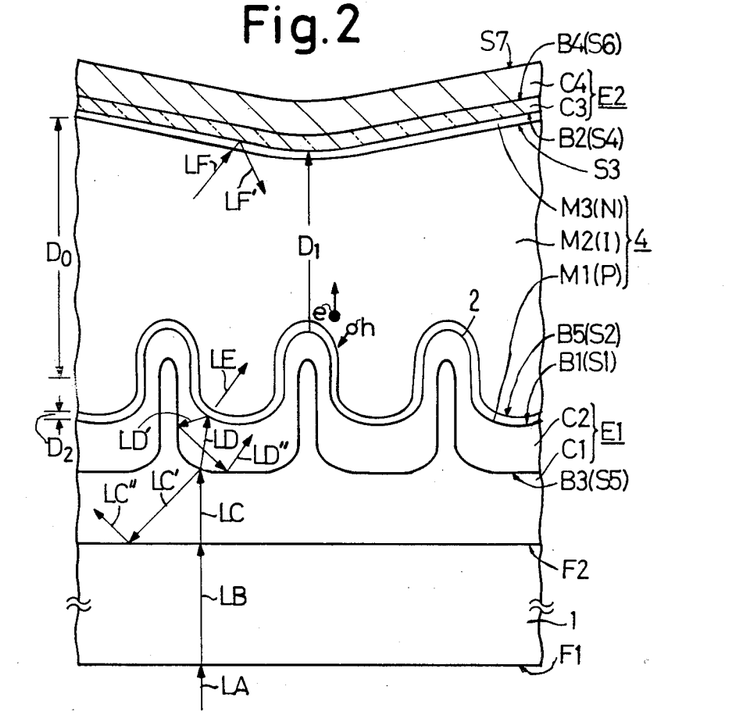
FIG. 2 is an enlarged cross-sectional view for assistance in explaining the embodiment shown in FIG. 1.

As will be seen from FIGS. 1 and 2, the light-transparent substrate 1 has a flat top surface F1. Its bottom surface may be uneven but is shown to be flat, as indicated by F2.

On the surface F2 of the light-transparent substrate 1 is formed a light-transparent conductive layer E1 for an electrode use, which is, for example, 800 to 6000 Å thick. The surface of the conductive layer E1 on the opposite side from the light-transparent substrate 1 is an uneven surface S1.

The uneven surface S1 includes a number of surfaces of acicular convexities 2 arranged two-dimensionally. These two-dimensionally arranged convexities 2 have a mean thickness of 500 to 2000 Å and a mean projection length of 300 to 1500 Å. The projecting ends of the convexities 2 are rounded. The convexities 2 may be arranged at random or regularly, but they are arranged two-dimensionally at a mean pitch or periodicity of 1000 to 5000 Å.

The conductive layer E1 may be of a single-layer structure, but it may preferably be of a two-layer structure which is comprised of a light-transparent conductive layer C1 formed on the surface F2 of the light-transparent substrate 1 in contact therewith and a light-transparent conductive layer C2 formed on the light-transparent conductive layer C1 in contact therewith, or a multilayer structure in which pluralities of such conductive layers C1 and C2 are successively laminated alternately with each other. In the drawings, the conductive layer E1 is shown to be of the two-layer structure mentioned above. The following description will be given on the assumption that the conductive layer E1 is of the two-layer construction.

The conductive layer C1 forming the conductive layer E1 is made of indium oxide, or a metallic oxide consisting principally thereof. The conductive layer C1 is, for instance, 400 to 3000 Å thick. On the opposite side from the light-transparent substrate 1 the conductive layer C1 has an uneven surface S5 the irregularities of which have one-to-one correspondence to the irregularities of the aforesaid uneven surface S1.

The conductive layer C2 forming the conductive layer E1 has a thickness, for instance, of 400 to 3000 angstroms. On the opposit side from the conductive layer C1 the conductive layer C2 has an uneven surface the irregularities of which have one-to-one correspondence to the irregularities of the uneven surface S5 of the conductive layer C1, and this uneven surface is the uneven surface S1 of the conductive layer E1. With the provision of such a conductive layer C2 on the uneven surface S5 of the conductive layer C1, there is formed between the conductive layers C1 and C2 an uneven boundary B3 which is the same as the uneven surface S5 of the conductive layer C1.

On the uneven surface S1 of the conductive layer E1 is formed a non-single-crystal semiconductor laminate member 4.

The non-single-crystal semiconductor laminate member 4 has a three-layer structure which is comprised of a P- or N-type, preferably, P-type non-single-crystal semiconductor layer M1, (which will hereinafter be assumed to be P-type), an I-type non-single-crystal semiconductor laminate layer M2 and non-single-crystal semiconductor layer M3 opposite in conductivity type from the layer M1 and which are laminated in this order. Alternatively, the non-single-crystal semiconductor laminate member 4 has a multilayer structure in which pluralities of such non-single-crystal semiconductor layers M1, M2, and M3 are laminated one after another. In the drawings, the non-single-crystal semiconductor laminate member 4 is shown to be of the three-layer construction. The following description will be given on the assumption that the non-single-crystal semiconductor laminate member 4 is of the three-layer structure. The non-single-crystal semiconductor layers M1, M2, and M3 form one PIN junction.

The non-single-crystal semiconductor layer M1 is formed on the uneven surface S1 of the conductive layer E1 in contact therewith to a thickness of, for example, 70 to 150 angstroms, preferably, 100 angstroms, forming an uneven surface B1 corresponding to the uneven surface S1 between the conductive layer E1 and the non-single-crystal semiconductor member 4. Since the non single-crystal semiconductor layer M1 is thin, it has, on the opposite side from the conductive layer E1, an uneven surface S2 the irregularities of which have one-to-one correspondence to the irregularities of the uneven surface S1 of the conductive layer E1 and accordingly, the irregularities of the uneven boundary B1 between the conductive layer E1 and the non-single-crystal semiconductor laminate member 4.

The non-single-crystal semiconductor layer M2 is formed on the uneven surface S2 of the non-single-crystal semiconductor layer M1 to a relatively large thickness of, for instance, 0.4 to 0.7μ. On the opposite side from the non-single-crystal semiconductor layer M1, the non-single-crystal semiconductor layer M2 has a surface formed by an uneven surface S3 whose irregularities each correspond to one or more, for example, on an average, 3 to 15 irregularities of the uneven surface S2 of the non-single-crystal semiconductor layer M1. In practice, the uneven surface S3 of the non-single-crystal semiconductor layer M2 is formed as such an uneven surface that one of its 3 to 15 irregularities, on an average, corresponds to 3 to 15 irregularities of the uneven surface S2 of the non-single-crystal semiconductor layer M1, since the layer M2 is formed relatively thin.

The non-single-crystal semiconductor layer M3 has a relatively small thickness of, for example, 100 to 200 angstroms and being on the opposite side from the non-single-crystal semiconductor layer M2, it has an uneven surface S4 whose irregularities have one-to-one correspondence to the irregularities of the uneven surface S3 of the the non-single-crystal semiconductor layer M2.

The surface of the non-single-crystal semiconductor laminate member 4 made up of the layers M1, M2, and M3 is the surface S4 of the layer M3, and hence it is formed by such an uneven surface S4 that one irregularity corresponds to one or more irregularities of the uneven boundary B1 between the conductive layer E1 and the non-single-crystal semiconductor laminate member 4. In practice, however, since the uneven surface S3 of the non-single-crystal semiconductor layer M2 has its 3 to 15 irregularity, on an average, corresponding to 3 to 15 irregularities of the uneven surface S2 of the non-single-crystal semiconductor layer M1 and consequently the uneven boundary B1, the uneven surface S4 of the non-single-crystal semiconductor laminate member 4 is formed by such an uneven surface that one of its irregularities, on an average, correspond to 3 to 15 of the irregularities of the boundary B1 between the conductive layer E1 and the non-single-crystal semiconductor laminate member 4.

With the formation of the non-single-crystal semiconductor laminate member 4 on the uneven surface S1 of the conductive layer E1 as described above, there is formed between the conductive layer E1 and the non-single-crystal semiconductor laminate member 4 the boundary B1 which is the same as the uneven surface S1 of the conductive layer E1.

The non-single-crystal semiconductor layer M1 of the non-single-crystal semiconductor laminate member 4 is formed of amorphous, semi-amorphous, or microcrystalline $Si_xC_{1-x}$ ($0<x<1$, where $x=0.8$, for example), and it has introduced thereinto a P-type impurity (boron, for instance,) with such a high concentration such as $1\times10^{19}$ to $6\times10^{20}$ atoms/cm$^3$.

The non-single-crystal semiconductor layer M2 is formed of, for instance, amorphous or semi-amorphous silicon, and it has introduced thereinto a P-type impurity (boron, for example) with such a concentration distribution that the impurity concentration linearly and continuously reduces towards the non-single-crystal semiconductor layer M3 in the thickwise direction of the layer M2. In this case, the ratio of the impurity concentration in the layer M2 at the end portion thereof on the side of the layer M3 to the impurity concentration at the end portion on the side of the layer M1 is 1/10 to 1/100, preferably, 1/20 to 1/40. In practice, the impurity concentration in the layer M2 is $2\times10^{15}$ to $2\times10^{17}$ atoms/cm$^3$ at the end portion on the side of the layer M1 and lower than $1\times10^{15}$ atoms/cm$^3$ at the end portion on the side of the layer M3.

The non-single-crystal semiconductor layer M3 is formed of, for instance, microcrystalline Si and has introduced thereinto an N-type impurity (phosphorus, for instance) with a concentration of $1\times10^{19}$ to $6\times10^{20}$ atoms/cm$^3$.

On the surface of the non-single-crystal semiconductor laminate member 4, formed by the uneven surface S4, there is formed a reflective conductive layer E2 which will ultimately serve as an electrode.

The conductive layer E2 may be a single layer formed of, for instance, aluminum, silver, or chromium, or a reflective metal material consisting principally thereof. It is preferable, however, that the conductive layer E2 be a laminated member which is comprised of a light-transparent conductive layer C3 formed of, for example, a light-transparent indium oxide, such as expressed by InO, or a light-transparent metallic oxide consisting principally thereof, and a reflective conductive layer C4 formed of, for instance, aluminum silver, chromium, or a metal consisting principally thereof, as shown.

In this case, the light-transparent conductive layer C3 has a relatively small thickness of 900 to 1300 angstroms, and has an uneven surface S6 corresponding to the uneven surface S4 of the non-single-crystal semiconductor laminate member 4.

The reflective conductive layer C4 is thicker than the light-transparent conductive layer C3. The surface of the reflective conductive layer C4 need not always be uneven but, in practice, it is an uneven surface S7 corresponding to the uneven surface S6 of the light-transparent conductive layer C3.

With the formation of the reflective conductive layer C4 on the light-transparent conductive layer C3, there is formed between them an uneven boundary B4 corresponding to the uneven surface S6 of the layer C3.

With the formation of the conductive layer E2 on the uneven surface S4 of the non-single-crytal semiconductor laminate member 4, there is formed between it and the laminate member 4 an uneven boundary B2 corresponding to the uneven surface S4 of the laminate member 4.

The semiconductor photoelectric conversion device of the present invention shown in FIGS. 1 and 2 produces the following operational effects:

When light LA is applied to the light-transparent substrate 1 on the side opposite from the conductive layer E1 perpendicularly to the flat substrate surface F1, the light LA mostly enters into the substrate 1 as indicated by LB.

A considerable portion of the light LB enters into the conductive layer C1 of the light-transparent conductive layer E1 as indicated by LC. The light LC mostly enters into the conductive layer C2 of the conductive layer E1 as indicated by LD. The light LD mostly enters into the non-single-crystal semiconductor laminate member 4 as indicated by LE.

Even if the light LC having passed into the conductive layer C1 of the conductive layer E1 is partly reflected at the uneven boundary B3 between the conductive layers C1 and C2, as indicated by LC', the reflected light LC' is reflected at the boundary between the substrate 1 and the conductive layer E1 and back to the non-single-crystal semiconductor laminate member 4, as indicated by LC''. Further, even if the light LD having passed into the conductive layer C2 of the conductive layer E1 is partly reflected at the uneven boundary B1 between the conductive layer E1 and the non-single-crystal semiconductor laminate member 4, as indicated by LD', the reflected light LD' is reflected at the uneven boundary B3 between the conductive layers C1 and C2 and back to the non-single-crystal semiconductor laminate member 4, as indicated by LD''.

Accordingly, the light (identified generally by LF), which enters into the non-single-crystal semiconductor laminate member 4 suffers a very small loss relative to the incident light LA.

Since the light LF directed to the non-single-crystal semiconductor laminate member 4 passes through the substrate 1, the boundary between it and the conductive layer E1, the conductive layer C1 of the conductive layer E1, the uneven boundary B3 between it and the conductive layer C2, and the boundary B1 between the conductive layer E1 and the non-single-crystal semiconductor laminate member 4, the light LF, after having entered into the non-single-crystal semiconductor laminate member 4, mostly travels therein in a direction oblique to its thickwise direction, as illustrated. While the light LF travels in the non-single-crystal semiconductor laminate member 4, electron-hole pairs are created mainly in the I-type non-single-crystal semiconductor layer M2 of the semiconductor laminate member 4.

In the case where the light LF travels in the non-single-crystal semiconductor laminate member 4, obliquely to its thickwise direction, from the uneven boundary B1 between the conductive layer E1 and the laminate member 4 to the uneven boundary B2 between it and the conductive layer E2, the light LF travels, for the greater part, a distance greater than the mean thickness $D_0$ of the semiconductor laminate member 4. Accordingly, the path length of the light LF from the uneven boundary B1 between the conductive layer E1 and the non-single-crystal semiconductor laminate member 4 to the uneven boundary B2 between the laminate member 4 and the conductive layer E2 is greater than the mean thickness $D_0$ of the laminate member 4.

Further, when entering into the conductive layer E2 after passing through the non-single-crystal semiconductor laminate member 4, the light LF is reflected at the uneven boundary B4 between the light-transparent conductive layer C3 and the reflective conductive layer C4, as indicated by LF' and the reflected light LF' is directed into the semiconductor laminate member 4.

For the reason given above, the electron-hole pairs can be created in the non-single-crystal semiconductor layer M2 of the non-single-crystal semiconductor laminate member 4 through efficient utilization of the light LF.

The holes h of the electron-hole pairs thus generated in the non-single-crystal semiconductor layer M2 of the laminate member 4 flow thereacross to reach the conductive layer E1, whereas the electrons e similarly flow across the laminate member 4 to reach the conductive layer E2, thus developing electromotive force between the conductive layers E1 and E2.

The distance between the inner sides of the conductive layers E1 and E2 has a minimum value $D_1$ between the vertex of each convexity of the uneven surface S1 of the conductive layer E1 and that portion of the conductive layer E2 which is in contact with the bottom of the recess of the uneven surface S4 of the non-single-crystal semiconductor laminate member 4 which is nearest to the abovesaid vertex of the convexity, as shown. The minimum value $D_1$ is smaller than the mean thickness $D_0$ of the laminate member 4. In the non-single-crystal semiconductor laminate member 4, the electric field intensity on the line of the minimum value $D_1$ is higher than the field intensity on any other line, so that the electrons e developed in the non-single-crystal semiconductor layer M2 of the laminate member 4 mostly flow along the line of the minimum value $D_1$ towards the conductive layer E2. The maximum value of the difference, $(D_1-D_2)$, between the thickness $D_1$ of the non-single-crystal semiconductor laminate member 4 on the line of the minimum value $D_1$ and the thickness $D_2$ of the non-single-crystal semiconductor layer M1 of the laminate member 4 cannot be selected greater than the maximum distance of travel over which the electrons e of the electron-hole pairs, created at or in the vicinity of the boundary B5 between the non-single-crystal semiconductor layers M1 and M2 of the laminate member 4 on the line of the minimum value $D_1$, can flow to reach the conductive layer E2.

But a minimum value of the difference, $(D_0-D_2)$, between the mean thickness $D_0$ of the laminate member 4 and the mean thickness $D_2$ of its non-single-semiconductor layer M1 is greater than the abovesaid maximum distance of travel $(D_1-D_2)$.

In consequence, when the light LF travels in the non-single-crystal semiconductor laminate member 4 from the uneven boundary B1 between it and the conductive layer E1 to the uneven boundary B2 between it and the conductive layer E2, the distance of travel of the light LF from the uneven boundary B5 between the non-single-crystal semiconductor layers M1 and M2 of the laminate member 4 to the uneven boundary B2 between it and the conductive layer E2 is greater than the above-said maximum distance of travel, $(D_1-D_2)$.

For the reason given above, the light LF incident on the non-single-crystal semiconductor laminate member 4 is utilized with high efficiency and the actual distance of travel of the electrons e to the conductive layer E2 can be reduced, ensuring the achievement of high photoelectric conversion efficiency.

On the other hand, since the conductive layer C2 of the conductive layer E1 used as an electrode and the non-single-crystal semiconductor layer M1 of the non-single-crystal semiconductor laminate member 4 are laminated through the uneven boundary B1, the contact area between them is sufficiently large, so that the contact resistance between them is sufficiently low. Furthermore, since the non-single-crystal semiconductor layer M1 contains a P-type impurity, and the conductive layer C2 is made of a tin oxide, or a metallic oxide consisting principally thereof, the contact resistance between them is sufficiently low. Accordingly, the contact resistance between the conductive layer E1 and the non-single-crystal semiconductor laminate member 4 is as low as 1Ω or less.

Moreover, since the non-single-crystal semiconductor layer M3 of the non-single-crystal semiconductor laminate member 4 and the conductive layer C3 of the conductive layer E2 used as an electrode are laminated through the uneven boundary B2, the contact area between the both layers is also sufficiently large. Since the non-single-crystal semiconductor layer M3 contains an N-type impurity, and since the conductive layer C3 is made of an indium oxide, or a metallic oxide consisting principally thereof, their contact resistance is sufficiently low. Accordingly, the contact resistance between the non-single-crystal semiconductor laminate member 4 and the conductive layer E2 is also as low as 1Ω or less.

Besides, the uneven boundary B4 between the conductive layer C3 and C4 has a high reflectivity, and the non-single-crystal semiconductor layer M1 of the non-single-crystal semiconductor laminate member 4 is formed of $Si_xC_{1-x}$, and hence has a large energy gap.

Accordingly, the semiconductor photoelectric conversion device of the present invention, shown in FIGS. 1 and 2, achieves a high photoelectric conversion efficiency.

Incidentally, according to my experiments, the light LF, which was derived from the incident light LA from the outside and which entered into the non-single-crystal semiconductor laminate member 4, was 78% of the light LA in a conventional photoelectric conversion device which was identical in construction with the device of the present invention shown in FIGS. 1 and 2 except that such boundaries as those between the conductive layer E1 and the non-single-crystal semiconductor laminate member 4 and between the laminate member 4 and the conductive layer E2 were flat surfaces extending along the substrate surface F2, the conductive layer E1 was single layer made of a tin or indium oxide, the conductive layer E2 was also single layer made of aluminum or silver and the non-single-crystal semiconductor layer M1 of the laminate member 4 was of Si. On the other hand, the light LF was 93% of the light LA in the semiconductor photoelectric conversion device of the present invention shown in FIGS. 1 and 2. Further, in the conventional device of the abovesaid construction, the open-circuit voltage was 0.81 to 0.91 V, short circuit current density 16.3 mA/cm$^2$, a fill factor 47 to 62% and photoelectric conversion efficiency 6.2 to 9.2%, whereas, in the semiconductor photoelectric conversion device of the present invention, the open-circuit voltage was 0.84 to 0.92 V, the short circuit current density 17.7 to 20.0 mA/cm$^2$, the fill factor 64 to 70% and the photoelectric conversion efficiency 9.9 to 11.7%. The experiments were conducted under the conditions that the substrate 1 was 3.0 mm long and 3.5 mm wide, and hence had an area of 0.105 cm$^2$, and the intensity of the light LA was AM1 (100 mW/cm$^2$).

Referring now to FIG. 3, manufacturing method will be described as being applied to the fabrication of the semiconductor photoelectric conversion device of the present invention described previously in connection with FIGS. 1 and 2.

In FIG. 3, the parts corresponding to those in FIGS. 1 and 2 are identified by the same reference numerals and no detailed description will be repeated.

Figure 3A:
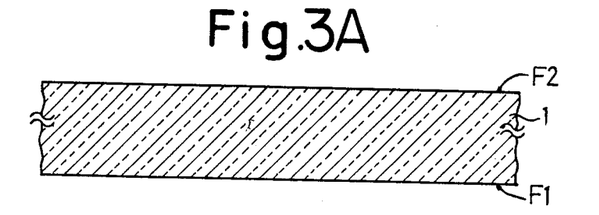
FIGS. 3A through 3G are schematic cross-sectional views illustrating a sequence of steps involved in the manufacture of the semiconductor photoelectric conversion device in accordance with an embodiment of the manufacturing method of the present invention.

The manufacturing method of the present invention shown in FIGS. 3 comprises the following consecutive steps:

The manufacture starts with the preparation of the light-transparent substrate 1 which has the pair of opposed flat surfaces F1 and F2 as described previously with respect to FIGS. 1 and 2 (FIG. 3A).

Figure 3B:
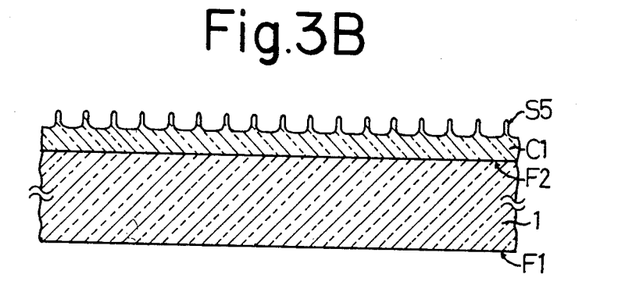

On the surface F2 of the light-transparent substrate 1 is formed the light-transparent conductive layer C1 which is made of an indium oxide (InO), or a metallic oxide consisting principally thereof and has a uneven surface S5 including a number of convexities (FIG. 3B).

In the case where the conductive layer C1 is made of indium oxide, it can easily be formed by an electron beam evaporation method in the following manner:

The substrate 1 is placed in a chamber, the interior of which is held at a vacuum pressure of, for example, about $1\times10^{-5}$ Torr, and the substrate 1 is heated up to a temperature of 300° to 600° C., preferably 350° to 550° C. At this condition, a raw material of the conductive layer C1 is evaporated using an electron beam so that a layer of indium oxide is deposited on the substrate 1 at a rate of 0.1 to 10 angstroms/second, for instance, 3 angstroms/second. In this case, it is also possible to connect a DC or high-frequency power supply to electrodes previously disposed in the chamber so as to produce the discharge of the vapor of the raw material of the conductive layer C1 in the chamber. Thus, a relatively soft conductive layer is obtained which corresponds to the conductive layer C1 having the uneven surface S5. Then, the conductive layer thus obtained is hardened by baking, providing the conductive layer C1.

Furthermore, in the case of using indium oxide for the conductive layer C1, it can also be formed by a low pressure CVD method or plasma CVD method employing an indium-halogen compound gas, such as $InCl_3$ gas, and an oxygen gas.

Also in the case of using a metallic oxide (containing, for example, $SnO_2$) consisting principally of indium oxide, the conductive layer C1 can be formed by a electron beam evaporation method, a low pressure CVD method, or a plasma CVD method in the same manner as described above.

Figure 3C:
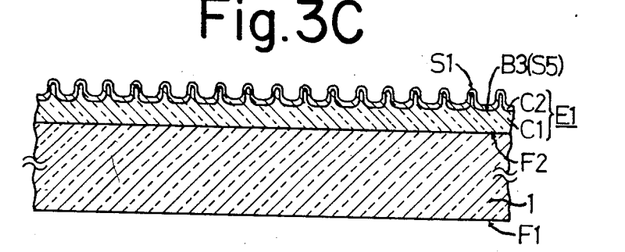

Next, the light-transparent conductive layer C2, which is made of a tin oxide, or a metallic oxide consisting principally thereof, having an uneven surface S1 including a number of which convexities and forms uneven boundary B3 between it and the conductive layer C1, is formed on the uneven surface S5 of the conductive layer C1 overlying the substrate 1 (FIG. 3C).

The conductive layer C2 can also be easily formed by an electron beam evaporation method, a low pressure CVD method or plasma CVD method using a tinhalogen compound gas, such as $SnCl_4$, and an oxygen gas, as is the case with the conductive layer C1.

In the manner described above, the conductive layer E1 comprised of the conductive layers C1 and C2 is formed on the light-transparent substrate 1.

Figure 3D:
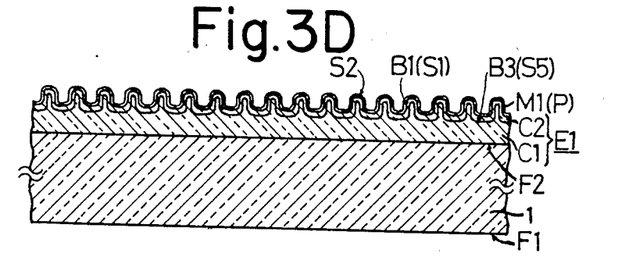
Figure 3E:
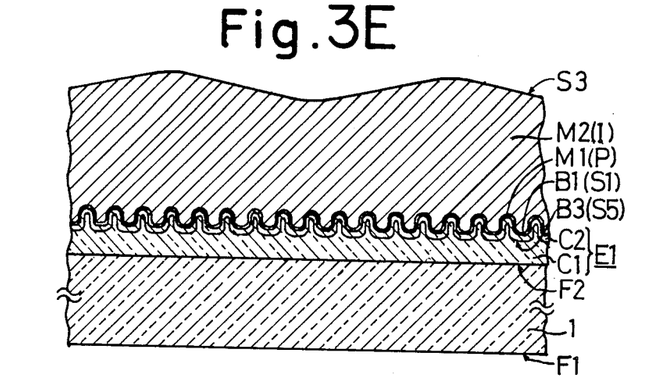
Figure 3F:
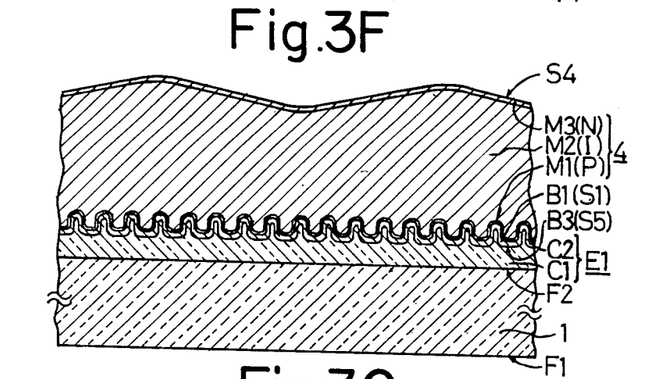

Next, the non-single-crystal semiconductor laminate member 4, comprised of the P-type non-single-crystal semiconductor layer M1, the I-type non-single-crystal semiconductor layer M2, and an N-type non-single-crystal semiconductor layer M3 laminated in this order, is formed on the light-transparent conductive layer E1 (FIGS. 3D to F).

In this case, the P-type non-single-crystal semiconductor layer M1 is formed as a layer having an uneven surface S2 including a number of convexities and is made of $Si_xC_{1-x}$ (where $0<x<1$), or a material consisting principally thereof, on the uneven surface S1 of the conductive layer E1, by a vapor growth (CVD) method which uses a methyl silane compound gas, as a semiconductor material gas, and an impurity material gas composed of a hydride or halide of a P-type impurity, for example, diborane ($B_2H_6$) (FIG. 3D).

In this case, the methyl silane compound gas may preferably be $SiH_{4-n}(CH_3)_n$ gas (where n=1, 2, 3), or $Si_2(CH_3)_nH_{6-n}$ gas (where n=1, 2, 3, 4, 5).

The CVD method used in this case may be a CVD method which does not employ a glow discharge (plasma) but may preferably be a CVD method which utilizes a glow discharge (plasma) which is caused by electric power or light.

The I-type non-single-crystal semiconductor layer M2 can be formed as a layer which has an uneven surface S3 and is made of silicon, on the uneven surface S2 of the P-type non-single-crystal semiconductor layer M1, by CVD techniques, such as CVD with or without a glow discharge (plasma) which is caused by electric power or light, or a CVD method employing light, using a semiconductor material gas composed of a hydride or halide of silicon, such as $Si_nH_{2n+2}$ (where $n \geq 1$) or $SiF_m$ (where $m \geq 2$), and an impurity material gas composed of a hydride or halide of a P-type impurity, such as diborane ($B_2H_6$) (FIG. 3E). In this case, it is preferable that by decreasing, with time, the concentration of the impurity material gas relative to the semiconductor material gas to a concentration below 5 ppm, the P-type impurity (boron) be introduced into the non-single-crystal semiconductor layer M2 with such a concentration distribution that the impurity concentration decreases linearly and continuously towards the non-single-crystal semiconductor layer M3 in the thickwise direction of the layer M2.

The non-single-crystal semiconductor layer M3 is formed as a layer having an uneven surface S4 and is made of silicon, on the uneven surface S3 of the non-single-crystal semiconductor layer M2, by the known CVD techniques, such as a CVD with or without a glow discharge (plasma), or a CVD method employing light, using a semiconductor material gas composed of a hydride or halide or silicon, such as $Si_nH_{2n+2}$ (wherein $n \geq 1$) or $SiF_m$ (wherein $m \geq 2$), and an impurity material gas composed of a hydride or halide of an N-type impurity, such as phosphine ($PH_3$) (FIG. 3F).

Figure 3G:
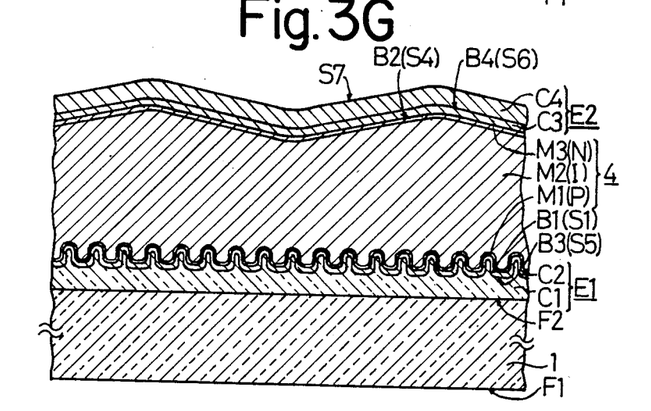

Next, the conductive layer E1, which is comprised of the light-transparent conductive layer C3 and the reflective conductive layer C4 laminated in this order, is formed on the uneven surface S4 of the non-single-crystal semiconductor laminate member 4 (FIG. 3G).

In this case, the light-transparent conductive layer C3 is formed as a layer which has its surface having an uneven surface S6 and is made of an indium oxide (InO), or a metallic oxide consisting principally thereof, on the uneven surface S4 of the non-single-crystal semiconductor laminate member 4, for example, by a known evaporation method.

The reflective conductive layer C4 is similarly formed, by a known evaporation method, of aluminum, tin, or chromium, or a metal consisting principally thereof, on the uneven surface S6 of the conductive layer C3 in a manner to form the uneven boundary B4 between the conductive layers C3 and C4.

In the manner described above, the reflective conductive layer E2 comprised of the light-transparent conductive layer C3 and the reflective conductive layer C4 is formed on the non-single-crystal semiconductor laminate member 4.

With such a manufacturing method of the present invention, though not described in detail, the semiconductor photoelectric conversion device of the present invention described previously in connection with FIGS. 1 and 2 can be manufactured with ease.

Furthermore, according to the manufacturing method of the present invention, the non-single-crystal semiconductor layer M1 of the non-single-crystal semiconductor laminate member 4, which is made of $Si_xC_{1-x}$, is formed, on the conductive layer E1, by a CVD method using a methyl silane compound ($SiH_4(CH_3)_n$ or $Si_2(CH_3)_nH_{6-2}$) gas. The methyl silane compound used in this CVD method originally contains bonds between silicon (Si) and carbon (C). Accordingly, when the CVD method utilizing a glow discharge (plasma) is employed, the power or energy for the glow discharge may be small.

By forming the non-single-crystal semiconductor layer M1 of $Si_xC_{1-x}$ on the conductive layer E1 through the CVD method using a glow discharge of small power or energy as mentioned above, the irregularities of the uneven surface S1 of the conductive layer E1 are not destroyed, and oxygen from the conductive layer E1 made of an oxide does not become incorporated into the non-single-crystal semiconductor layer M1.

Accordingly, the non-single-crystal semiconductor layer M1 of $Si_xC_{1-x}$ can easily be obtained which is high in carbon (C) concentration and in electric conductivity and large in energy gap.

Figure 4:
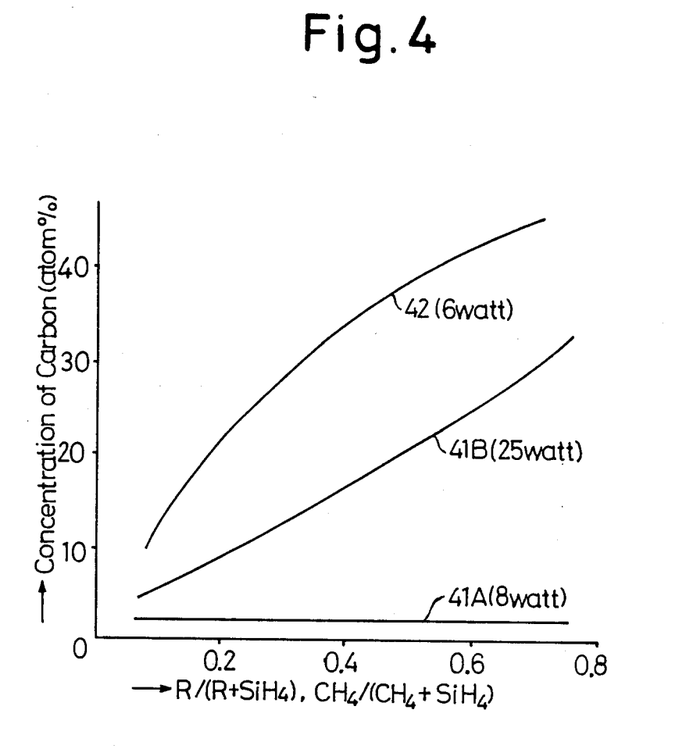
FIG. 4 is a graph showing the relationship of the value of $(1-x)$ in $Si_xC_{1-x}$ to the amount of a methyl silane compound gas, in comparison with the relationship of the value of $(1-x)$ to the amount of methane gas, for assistance in explaining the step of forming the first non-single-crystal semiconductor layer of $Si_xC_{1-x}$ or a material consisting principally thereof in accordance with the manufacturing method of the present invention.

Incidentally, FIG. 4 shows, using the glow discharge power (W) as a parameter, the relationship of the carbon concentration (atom %) in $Si_xC_{1-x}$ to the composition of semiconductor raw material gas in the case of forming the non-single-crystal semiconductor layer M1 of $Si_xC_{1-x}$ by the CVD method using the glow discharge. In FIG. 4, reference numerals 41A and 41B show the relationships between the carbon concentration (atom %) in the deposited $Si_xC_{1-x}$ to the ratio of methane gas ($CH_4$) gas to a mixture of silane ($SiH_4$) gas and methane ($CH_4$) gas in the case of forming the non-single-crystal semiconductor layer M1 of $Si_xC_{1-x}$ through using the silane ($SiCH_4$) gas and the methane ($CH_4$) gas without employing the method of the present invention. In FIG. 4, reference numeral 42 shows a similar relationship of the carbon concentration to the ratio of the methyl silane compound gas to a mixture (indentified as R) of methyl silane compound gas and silane gas in the case of the present invention. It is evident from FIG. 4 that a non-single-crystal semiconductor layer M1 of $Si_xC_{1-x}$ of a high carbon concentration can be formed according to the present invention.

Figure 5:
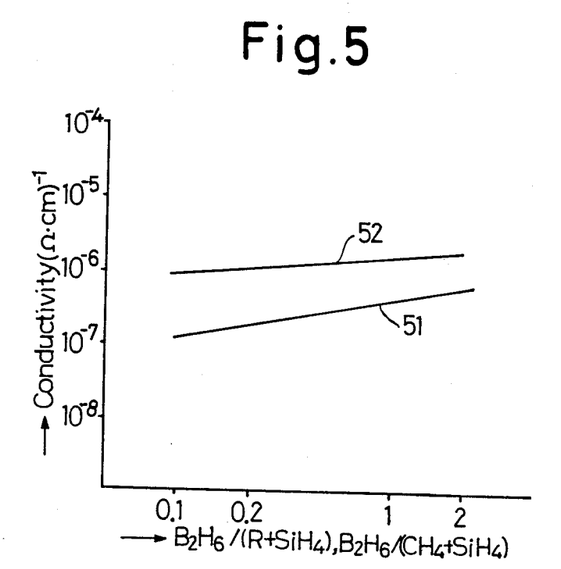
FIG. 5 is a graph showing the relationship of the electric conductivity of the first non-single-crystal semiconductor layer to the amount of an impurity gas, in comparison with the relationship in a conventional semiconductor photoelectric conversion device mannufacturing method, for assistance in explaining the step of forming the first non-single-crystal semiconductor layer.

FIG. 5 shows the relationship between the electric conductivity $(\Omega \cdot cm)^{-1}$ of the non-single-crystal semiconductor layer M1 to the ratio of the P-type impurity gas to the semiconductor raw material gas in the case of forming the P-type non-single-crystal semiconductor layer M1 of $Si_xC_{1-x}$. In FIG. 5, reference numeral 51 shows the relationship between the electric conductivity $(\Omega \cdot cm)^{-1}$ of the non-single-crystal semiconductor layer M1 and the ratio of diborane ($B_2H_6$) gas to a mixture of silane ($SiH_4$) gas and methane ($CH_4$) gas in the case of forming the P-type non-single-crystal semiconductor layer M1 of $Si_xC_{1-x}$ using silane ($SiH_4$), methane ($CH_4$), and diborane ($B_2H_6$) as a P-type impurity gas, without employing the method of the present invention. In FIG. 5, reference numeral 52 shows a similar relationship between the electric conductivity and the ratio of diborane gas to a gas mixture of methyl silane compound (R) gas and silane gas in the case of the present invention. From FIG. 5 it is evident that according to the present invention, a non-single-crystal semiconductor layer M1 of high electric conductivity can be formed.

Figure 6:
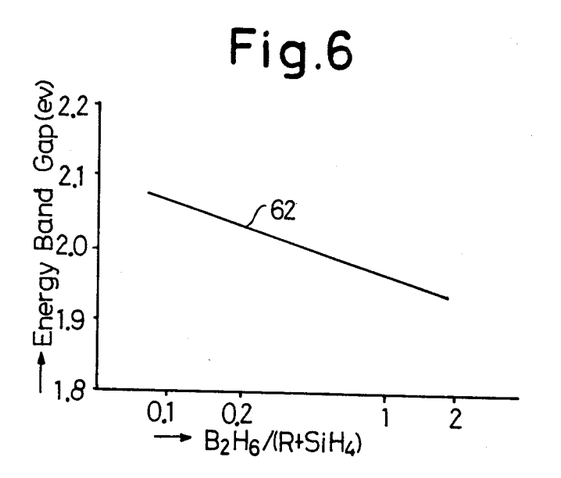
FIG. 6 is a graph showing the relationship of the energy gap of the first non-single-crystal semiconductor layer to the amount of the impurity gas, in comparison with the relationship in the conventional semiconductor photoelectric conversion device manufacturing method, for assistance in explaining the step of forming the first non-single-crystal semiconductor layer.

FIG. 6 shows the relationship between the band gap energy (eV) of the non-single-crystal semiconductor layer M1 and the ratio of diborane ($B_2H_6$) as a P-type impurity gas to a gas mixture of methyl silane compound (R) gas and silane ($SiH_4$) gas in the case of forming the non-single-crystal semiconductor layer M1 of $Si_xC_{1-x}$. It is evident from FIG. 6 that according to the present invention, a non-single-crystal semiconductor layer M1 of large energy gap can be obtained.

While in the foregoing the semiconductor photoelectric conversion device has been described in connection with the case where the non-single-crystal semiconductor laminate member has formed therein one PIN junction, the laminate member can also be arranged to form two or more PIN junctions, or one or more PN junctions.

Besides, the foregoing has described only one embodiment of each of the semiconductor photoelectric conversion device, the light-transparent substrate therefor and the manufacturing methods of the present invention, and it will be apparent that many modifications and variations may be effected without departing from the scope of the novel concepts of the present invention.

What is claimed is:

1. A semiconductor photoelectric conversion device, comprising:
   a light transparent substrate;
   a light transparent conductive layer formed on the light transparent substrate to serve as a first electrode;
   a non-single-crystal semiconductor laminate member having a P- or N-type first non-single-crystal semiconductor layer formed on the conductive layer serving as the first electrode, an I-type second non-single-crystal semiconductor layer formed on the first non-single-crystal semiconductor layer and a third non-single-crystal semiconductor layer formed on the second non-single-crystal semiconductor layer and opposite in conductivity type from the first non-single-crystal semiconductor layer; and
   a conductive layer formed on the non-single-crystal semiconductor laminate member to serve as a second electrode;
   wherein the first non-single-crystal semiconductor layer of the non-single-crystal semiconductor laminate member is formed of $Si_xC_{1-x}$ (where $0 > x > 1$) or a material consisting principally thereof;
   wherein the surface of the conductive layer serving as the first electrode is a first uneven surface which includes a number of surfaces of acicular convexities arranged two-dimensionally to form a first uneven boundary corresponding to the first uneven surface between the conductive layer serving as the first electrode and the first non-single-crystal semiconductor layer of the non-single-crystal semiconductor laminate member;
   wherein the conductive layer serving as the second electrode is reflective; and
   wherein the surface of the non-single-crystal semiconductor laminate member in contact with the conductive layer serving as a second electrode is a second uneven surface which includes a number of surfaces of convexities arranged two-dimensionally at a mean periodicity larger than that of the acicular convexities of the first unevne surface to thereby form a second uneven boundary corresponding to the second uneven surface between the non-single-crystal semiconductor laminate member and the conductive layer serving as the second electrode.

2. A semiconductor photoelectric conversion device according to claim 1, wherein the second uneven surface is such that one of its convexities corresponds to 3 to 15 convexities of the first uneven surface.

3. A semiconductor photoelectric conversion device according to claim 1, wherein the acicular convexities of the first uneven surface are arranged at mean periodicity of 1000 to 5000 A.

4. A semiconductor photoelectric conversion device according to claim 3, wherein the acicular convexities of the first uneven surface have a mean thickness of 500 to 2000 A and a mean length of 300 to 1500 A.

5. A semiconductor photoelectric conversion device according to claim 1, wherein the conductive layer serving as the first electrode is comprised of a first light transparent conductive layer formed on the light transparent substrate and a second light transparent conductive layer formed on the first light transparent conductive layer, the first light transparent conductive layer being formed of indium oxide, or a metallic oxide consisting principally thereof, and the second light transparent conductive layer being formed of tin oxide, or a metallic oxide consisting principally thereof, wherein the first and second light transparent conductive layers are laminated to form therebetween a third uneven boundary which corresponds to the first uneven boundary, and wherein the second light transparent conductive layer and the first non-single-crystal semiconductor layer of the non-single-crystal semiconductor laminate member are laminated to form therebetween the first uneven boundary.

6. A semiconductor photoelectric conversion device according to claim 5, wherein the first light transparent conductive layer of the conductive layer serving as a first electrode has a mean thickness of 400 to 3000 A and the second light transparent conductive layer of the conductive layer serving as a first electrode has a mean thickness of 400 to 3000 A.

7. A semiconductor photoelectric conversion device according to claim 5, wherein the conductive layer serving as the second electrode is comprised of a third lighttransparent conductive layer and a fourth, reflective conductive layer formed on the third light transparent conductive layer, the third light transparent conductive layer being formed of indium oxide, or a metallic oxide consisting principally thereof, and the fourth, reflective conductive layer being formed of aluminum, silver, or chromium, or a metal consisting principally thereof, wherein the non-single-crystal semiconductor laminate member and the third light transparent conductive layer are laminated to form therebetween the second uneven boundary, and wherein the third light transparent and fourth, reflective conductive layers are laminated to form therebetween a fourth uneven boundary which corresponds to the second uneven boundary.

8. A semiconductor photoelectric conversion device according to claim 1, wherein the conductive layer serving as the second electrode is comprised of a third light-transparent conductive layer and a fourth, reflective conductive layer formed on the third light transparent conductive layer, the third light transparent conductive layer being formed indium oxide, or a metallic oxide consisting principally thereof, and the fourth, reflective conductive layer being formed of aluminum, silver, or chromium, or a metal consisting principally thereof, wherein the non-single-crystal semiconductor laminate member and the third light transparent conductive layer are laminated to form therebetween the second uneven boundary, and wherein the third light transparent and fourth, reflective conductive layers are laminated to form therebetween a third uneven boundary which corresponds to the second uneven boundary.

9. A method of making a semiconductor photoelectric conversion device, comprising the steps of:
forming a conductive layer serving as a first electrode on a light-transparent substrate;
forming, on the conductive layer serving as a first electrode, a non-single-crystal semiconductor laminate member having a P- or N-type first non-single-crystal semiconductor layer formed on the conductive layer serving as a first electrode, an I-type second non-single-crystal semiconductor layer formed on the first non-single-crystal semiconductor layer, and a third non-single-crystal semiconductor layer formed on the second non-single-crystal semiconductor layer and opposite in conductivity from the first non-single-crystal semiconductor layer; and
forming a conductive layer serving as a second electrode on the non-single-crystal semiconductor laminate member;
wherein the step of forming the conductive layer serving as a first electrode includes the step of forming, on the light-transparent substrate, a light-transparent conductive layer, as the conductive layer serving as a first electrode, the surface of which is formed by a first uneven surface which includes a number of surfaces of acicular convexities arranged two-dimensionally,
wherein the step of forming the non-single-crystal semiconductor laminate member includes the step of depositing, on the first uneven surface of the conductive layer serving as a first electrode, by a CVD method (chemical vapor depositing method), a P- or N-type non-single-crystal semiconductor layer of $Si_xC_{1-x}$ (where $0<x<1$), as the first non-single-crystal semiconductor layer, which has a surface formed by a second uneven surface and forms between it and the conductive layer serving as a first electrode a first uneven boundary corresponding to the first uneven surface, the step of depositing, as the second non-single-crystal semiconductor layer, by a CVD method, on the second uneven surface of the non-single-crystal semiconductor laminate member, a non-single-crystal semiconductor layer having a surface formed by a third uneven surface which includes a number of surfaces of convexities arranged two-dimensionally at a mean periodicity larger than that of the acicular convexities of the first uneven surface, and the step of depositing, as the third non-single-crystal semiconductor layer, by a CVD method, on the third uneven surface of the second non-single-crystal semiconductor layer, a non-single-crystal semiconductor layer having a surface formed by a fourth uneven surface which corresponds to the third uneven surface, and
wherein the step of forming the conductive layer serving as a second electrode includes a step of forming a reflective conductive layer, as the conductive layer serving as a second electrode, on the fourth uneven surface in a manner to form between it and the third non-single-crystal semiconductor layer a second uneven boundary corresponding to the fourth uneven surface.

10. A method according to claim 9, wherein the third uneven surface is such that one of its convexities correspond to 3 to 15 convexities of the first uneven surface.

11. A method according to claim 9, wherein the acicular convexities of the first uneven surface are arranged at mean periodicity of 1000 to 5000 A.

12. A method according to claim 9, wherein the acicular convexities of the first uneven surface have a mean thickness of 500 to 2000 A and a mean length of 300 to 1500 A.

13. A method according to claim 9, wherein the conductive layer for the first electrode is comprised of a first light transparent conductive layer formed on the light transparent substrate and a second light transparent conductive layer formed on the first light transparent conductive layer, the first light transparent conductive layer being formed of indium oxide, or a metallic oxide consisting principally thereof, and the second light transparent conductive layer being formed of tin oxide, or a metallic oxide consisting principally thereof, wherein the first and second light transparent conductive layers are laminated to form therebetween a third and uneven boundary which corresponds to the first uneven boundary, and wherein the second light transparent conductive layer and the first non-single-crystal semiconductor layer of the non-single-crystal semiconductor laminate member are laminated to form therebetween the first uneven boundary.

14. A method according to claim 13, wherein the first light transparent conductive layer of the conductive layer serving as a first electrode has a mean thickness of 400 to 3000 Å and the second light transparent conductive layer of the conductive layer serving as a first electrode has a mean thickness of 400 to 3000 Å.

15. A method according to claim 13, wherein the conductive layer serving as the second electrode is comprised of a third light-transparent conductive layer and a fourth, reflective conductive layer formed on the third light transparent conductive layer, the third light transparent conductive layer being formed of indium oxide, or a metallic oxide consisting principally thereof, and the fourth, reflective conductive layer being formed of aluminum, silver, or chromium, or a metal consisting principally thereof, wherein the non-single-crystal semiconductor laminate member and the third light transparent conductive layer are laminated to form therebetween the second uneven boundary, and wherein the third light transparent and fourth, reflective conductive layers are laminated to form therebetween a fourth uneven boundary which corresponds to the second uneven boundary.

16. A method according to claim 9, wherein the conductive layer serving as the second electrode is comprised of a third light-transparent conductive layer and a fourth, reflective conductive layer formed on the third light transparent conductive layer, the third light transparent conductive layer being formed of indium oxide, or a metallic oxide consisting principally thereof, and the fourth, reflective conductive layer being formed of aluminum, silver, or chromium, or a metal consisting principally thereof, wherein the non-single-crystal semiconductor laminate member and the third light transparent conductive layer are laminated to form therebetween the second uneven boundary, and wherein the third light transparent and fourth, reflective conductive layers are laminated to form therebetween a third uneven boundary which corresponds to the second uneven boundary.

* * * * *